(12) United States Patent
Zhang et al.

(10) Patent No.: US 12,323,126 B2
(45) Date of Patent: Jun. 3, 2025

(54) LATERALLY EXCITED BULK WAVE RESONATOR AND FABRICATING METHOD THEREOF

(71) Applicant: HANGZHOU SAPPLAND MICROELECTRONICS TECHNOLOGY CO., LTD., Zhejiang (CN)

(72) Inventors: Shumin Zhang, Zhejiang (CN); Jiansheng Liu, Zhejiang (CN); Guohao Wang, Zhejiang (CN)

(73) Assignee: HANGZHOU SAPPLAND MICROELECTRONICS TECHNOLOGY CO., LTD., Zhejiang (CN)

( * ) Notice: Subject to any disclaimer, the term of this patent is extended or adjusted under 35 U.S.C. 154(b) by 237 days.

(21) Appl. No.: 18/056,290

(22) Filed: Nov. 17, 2022

(65) Prior Publication Data

US 2023/0231533 A1    Jul. 20, 2023

(30) Foreign Application Priority Data

Jan. 18, 2022    (CN) .......................... 202210056859.9

(51) Int. Cl.
| | | |
|---|---|---|
| *H03H 9/02* | (2006.01) | |
| *H03H 9/05* | (2006.01) | |
| *H03H 9/10* | (2006.01) | |

(52) U.S. Cl.
CPC .... *H03H 9/02228* (2013.01); *H03H 9/02015* (2013.01); *H03H 9/0504* (2013.01); *H03H 9/1035* (2013.01)

(58) Field of Classification Search
CPC .......... H03H 9/02228; H03H 9/02015; H03H 9/0504; H03H 9/1035; H03H 9/02102; H03H 9/174; H03H 9/171; H03H 3/02; H03H 9/13
See application file for complete search history.

(56) References Cited

U.S. PATENT DOCUMENTS

| | | | | |
|---|---|---|---|---|
| 11,258,423 | B2* | 2/2022 | Rinaldi | .................. H03H 9/462 |
| 2021/0058054 | A1* | 2/2021 | Kaajakari | .......... H03H 9/02007 |
| 2021/0384885 | A1* | 12/2021 | Daimon | ............. H03H 9/02834 |

FOREIGN PATENT DOCUMENTS

CN            111030626 A  *  4/2020

* cited by examiner

*Primary Examiner* — Andrea Lindgren Baltzell
*Assistant Examiner* — Kimberly E Glenn
(74) *Attorney, Agent, or Firm* — Hodgson Russ LLP

(57) ABSTRACT

A laterally excited bulk wave resonator includes a supporting plate; a piezoelectric base having a back side attached to the supporting plate, in which a cavity is defined on a side of the supporting plate facing toward the piezoelectric base; a lower interdigital transducer provided at a back side of the piezoelectric base and located in the cavity; and an upper interdigital transducer provided at a front side of the piezoelectric base corresponding to the lower interdigital transducer. A first interdigital electrode of the lower interdigital transducer has a same polarity as a second interdigital electrode of the upper interdigital transducer at a position corresponding to the first interdigital electrode.

16 Claims, 3 Drawing Sheets

LATERALLY EXCITED BULK WAVE RESONATOR AND FABRICATING METHOD THEREOF

CROSS-REFERENCE TO RELATED APPLICATION

This application claims priority to Chinese Patent Application No. 202210056859.9, filed on Jan. 18, 2022, the entire disclosure of which is incorporated herein by reference.

FIELD

The present disclosure relates to a resonator technical field, and more particularly to a laterally excited bulk wave resonator and a fabricating method thereof.

BACKGROUND

With the development of the fifth-generation (5G) mobile communication technology, there is a need to develop a radio frequency (RF) communication technology having a higher frequency, a greater relative bandwidth and a higher power. The traditional technologies, such as a surface acoustic wave (SAW) technology and a temperature compensated surface acoustic wave (TC-SAW) technology, are limited by the power density and the photolithography technology, and are hardly applied to scenarios having a frequency above 3.5 GHz. The bulk acoustic wave (BAW) technology and the film bulk acoustic resonator (FBAR) technology hardly achieve a relative bandwidth of more than 8% no matter whether the piezoelectric layer includes AlN or Sc-doped AlN.

A laterally excited bulk wave resonator (XBAR) technology is used to solve the above-mentioned problem. A LiNbO$_3$ single crystal thin plate is bonded on a supporting plate, and a metal electrode is formed on the LiNbO$_3$ plate, such that a laterally excited wave, that is, an A1-mode Lamb wave, may be generated. The A1 mode has high sound speed and a large electromechanical coupling coefficient, such that the XBAR technology may be used in RF filter scenarios having a frequency of up to 3.5 GHz and a relative bandwidth of more than 10%.

However, for the XBAR devices, there are generally parasitic modes such as S0 and A0 near the A1 mode, which not only causes a lot of clutters on an admittance characteristic curve of an XBAR resonator, but also causes energy leakage. Thus, a quality (Q) factor of the device will be significantly affected.

SUMMARY

In order to solve at least one of the problems existing in the related art to at least some extent, a laterally excited bulk wave resonator and a fabricating method thereof are provided.

In a first aspect of some embodiments in the present disclosure, a laterally excited bulk wave resonator is provided. The laterally excited bulk wave resonator includes a supporting plate; a piezoelectric base having a back side attached to the supporting plate, in which a cavity is defined on a side of the supporting plate facing toward the piezoelectric base; a lower interdigital transducer provided at a back side of the piezoelectric base and located in the cavity; and an upper interdigital transducer provided at a front side of the piezoelectric base corresponding to the lower interdigital transducer. A first interdigital electrode of the lower interdigital transducer has a same polarity as a second interdigital electrode of the upper interdigital transducer at a position corresponding to the first interdigital electrode.

In some embodiments, a first bus bar of the lower interdigital transducer is electrically connected with a second bus bar of the upper interdigital transducer at a position corresponding to the first bus bar.

In some embodiments, the laterally excited bulk wave resonator further includes a metallized through hole provided at a position of the piezoelectric base corresponding to the bus bars, and configured to connect the first bus bar of the lower interdigital transducer with the second bus bar of the upper interdigital transducer.

In some embodiments, the laterally excited bulk wave resonator further includes a first dielectric layer provided on the back side of the piezoelectric base, and configured to cover the lower interdigital transducer.

In some embodiments, the laterally excited bulk wave resonator further includes a second dielectric layer provided on the front side of the piezoelectric base, and configured to cover the upper interdigital transducer.

In some embodiments, a sum of a thickness of the first dielectric layer, a thickness of the second dielectric layer and a thickness of the piezoelectric base is an odd multiple of a half-wavelength.

In some embodiments, the laterally excited bulk wave resonator further includes a through hole running through the piezoelectric base, and located in a first gap between a first interdigital electrode of the lower interdigital transducer and the first bus bar of the lower interdigital transducer and a second gap between a second interdigital electrode of the upper interdigital transducer and the second bus bar of the upper interdigital transducer.

In some embodiments, the lower interdigital transducer includes a first lower bus bar and a second lower bus bar, as well as a first lower electrode connected with the first lower bus bar and a second lower electrode connected with the second lower bus bar; and the upper interdigital transducer includes a first upper bus bar corresponding to the first lower bus bar and a second upper bus bar corresponding to the second lower bus bar, as well as a first upper electrode connected with the first upper bus bar and a second upper electrode connected with the second upper bus bar.

In some embodiments, the laterally excited bulk wave resonator further includes a first through hole running through the piezoelectric base, and located in a first gap between the first lower electrode and the second lower bus bar of the lower interdigital transducer and a second gap between the first upper electrode and the second upper bus bar of the upper interdigital transducer.

In some embodiments, the laterally excited bulk wave resonator further includes a second through hole running through the piezoelectric base, and located in a third gap between the second lower electrode and the first lower bus bar of the lower interdigital transducer and a fourth gap between the second upper electrode and the first upper bus bar of the upper interdigital transducer.

In a second aspect of some embodiments in the present disclosure, a method for fabricating a laterally excited bulk wave resonator is provided. The method includes providing a supporting plate; forming a cavity in a surface of the supporting plate; providing a piezoelectric base; forming a lower interdigital transducer by providing a first metal electrode on a back side of the piezoelectric base; bonding the back side of the piezoelectric base to the surface of the supporting plate, such that the lower interdigital transducer is located in the cavity; forming an upper interdigital transducer corresponding to the lower interdigital transducer by providing a second metal electrode on a front side of the piezoelectric base corresponding to the first metal electrode of the lower interdigital transducer; and electrically connecting the upper interdigital transducer to the lower interdigital transducer.

In some embodiments, the method further includes providing a first dielectric layer on the back side of the piezoelectric base to cover the lower interdigital transducer.

In some embodiments, the method further includes providing a second dielectric layer on the front side of the piezoelectric base to cover the upper interdigital transducer.

In some embodiments, electrically connecting the upper interdigital transducer to the lower interdigital transducer includes forming a metallized through hole connecting a first bus bar of the lower interdigital transducer with a second bus bar of the upper interdigital transducer.

In some embodiments, the method further includes forming a through hole running through the piezoelectric base, and located in a first gap between a first interdigital electrode of the lower interdigital transducer and the first bus bar of the lower interdigital transducer and a second gap between a second interdigital electrode of the upper interdigital transducer and the second bus bar of the upper interdigital transducer.

In some embodiments, forming the lower interdigital transducer includes forming a first lower bus bar and a second lower bus bar, as well as a first lower electrode connected with the first lower bus bar and a second lower electrode connected with the second lower bus bar; and forming the upper interdigital transducer includes forming a first upper bus bar corresponding to the first lower bus bar and a second upper bus bar corresponding to the second lower bus bar, as well as a first upper electrode connected with the first upper bus bar and a second upper electrode connected with the second upper bus bar.

In some embodiments, the method further includes forming a first through hole running through the piezoelectric base, and located in a first gap between the first lower electrode and the second lower bus bar of the lower interdigital transducer and a second gap between the first upper electrode and the second upper bus bar of the upper interdigital transducer.

In some embodiments, the method further includes forming a second through hole running through the piezoelectric base, and located in a third gap between the second lower electrode and the first lower bus bar of the lower interdigital transducer and a fourth gap between the second upper electrode and the first upper bus bar of the upper interdigital transducer.

BRIEF DESCRIPTION OF THE DRAWINGS

In order to illustrate the present disclosure more clearly, some embodiments of the present disclosure will be further described in the following with reference to the drawings. It will be appreciated that the drawings described below are only related to some embodiments of the present disclosure, based on which other drawings and related embodiments can also be obtained by those skilled in the art without creative work.

REFERENCE NUMERALS

Figure 1:
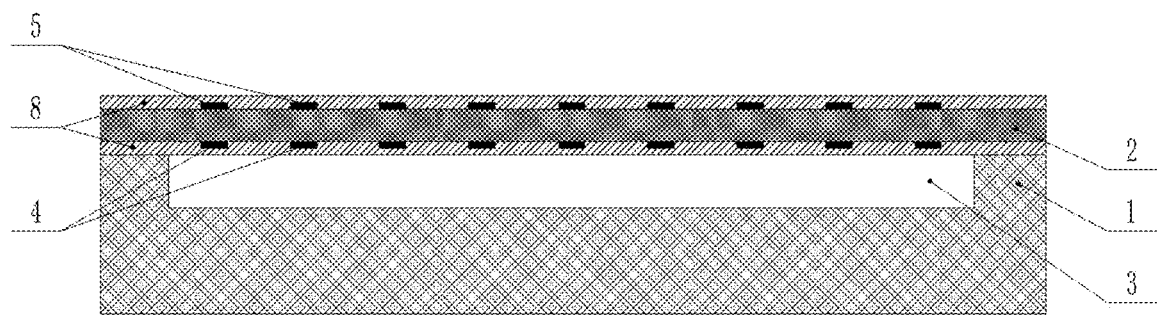
FIG. 1 is a schematic cross-sectional view showing a laterally excited bulk wave resonator in an embodiment of the present disclosure.

1: supporting plate; 2: piezoelectric base; 3: cavity; 4: lower interdigital transducer; 5: upper interdigital transducer; 6: bus bar; 7: metallized through hole; 8: dielectric layer; 9: interdigital electrode; 10: through hole.

DETAILED DESCRIPTION

Technical solutions of embodiments in the present disclosure will be described clearly and completely below in combination with accompanying drawings of embodiments. It will be understood by those skilled in the art that embodiments described hereinafter are only some of embodiments of the present disclosure, rather than all embodiments of the present disclosure. The same or similar elements are denoted by same reference numeral in different drawings unless indicated otherwise. Implementations described in the following exemplary embodiments do not represent all implementations consistent with the present disclosure. On the contrary, these implementations are only examples of devices and methods consistent with some aspects of the present disclosure as detailed in the appended claims. Any other embodiments obtainable by those skilled in the art on the basis of embodiments described herein without creative work fall within the protection scope of the present disclosure.

Terms used herein in the specification of the present disclosure are only for the purpose of describing specific embodiments, but should not be construed to limit the present disclosure. In the specification of the present disclosure, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," and "counterclockwise" should be construed to refer to the orientation or position relationship as shown in the drawings, which are only for the convenience of describing the present disclosure and simplifying the description, rather than indicating or implying that the device or element referred to must have a specific orientation, or be constructed and operated in a specific orientation, and thus should not be understood to limit the present disclosure. In addition, terms such as "first" and "second" are used herein for purposes of description and are not intended to indicate or imply relative importance or significance or to imply the number of indicated technical features. Thus, the feature defined with "first" and "second" may include one or more of the feature. In the description of the present invention, "a plurality of" means two or more than two, unless specified otherwise.

In the description of the present disclosure, it should be understood that, unless specified or limited otherwise, the terms "mounted," "connected," and "coupled" and variations thereof are used broadly, and may be, for example, fixed connections, detachable connections, or integral connections; may also be mechanical or electrical connections; may also be direct connections or indirect connections via intervening structures; may also be inner communications of two elements or interaction between two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature. The exemplary embodiments of the present disclosure will be described in detail below in combination with the accompanying drawings. Without conflict, features in the following embodiments and implementations can be complemented or combined with each other.

Terms used herein in the description of the present disclosure are only for the purpose of describing specific embodiments, but should not be construed to limit the present disclosure. The singular forms of "one", "said" and "the" used in the present disclosure and the appended claims are also intended to include plural forms, unless the context clearly indicates other meanings.

In order to make the objects, technical solutions and advantages of the present disclosure clearer, the present disclosure is further described in detail below in combination with the accompanying drawings and embodiments. It should be understood that the embodiments described herein are only used to explain the present disclosure, but not to limit the present disclosure.

In a first aspect of some embodiments in the present disclosure, a laterally excited bulk wave resonator is provided. As shown in FIG. 1, the laterally excited bulk wave resonator includes a supporting plate 1 and a piezoelectric base 2 having a back side attached to the supporting plate 1. A cavity 3 is defined on a side of the supporting plate 1 facing toward the piezoelectric base 2. A lower interdigital transducer 4 is provided at the back side of the piezoelectric base 2 and located in the cavity 3, and an upper interdigital transducer 5 is provided at a front side of the piezoelectric base 2 corresponding to the lower interdigital transducer 4. A first interdigital electrode of the lower interdigital transducer 4 has a same polarity as a second interdigital electrode of the upper interdigital transducer 5 at a position corresponding to the first interdigital electrode.

The supporting plate 1 may be formed of a semiconductor material, such as Si, SiC, GaN, $Al_2O_3$ and diamond. The piezoelectric base 2 may be formed of a piezoelectric material selected from lithium niobate, lithium tantalate, quartz, aluminum nitride and lead zirconate titanate. The lower interdigital transducer 4 and the upper interdigital transducer 5 may be formed of a material selected from Al, Cu, Au, Ag, Pt, Ti, W or a combination thereof. A position of the upper interdigital transducer 5 and a position of the lower interdigital transducer 4 may be symmetrical with respect to the piezoelectric base 2, and the first interdigital electrode of the lower interdigital transducer 4 may have a same thickness or width as, or a different thickness or width from the second interdigital electrode of the upper interdigital transducer 5.

Figure 2:
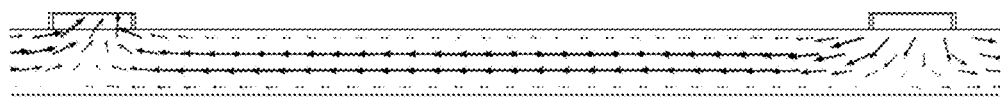
FIG. 2 is a schematic diagram showing a polarization electric field generated by a parasitic mode in a related art.
Figure 3:
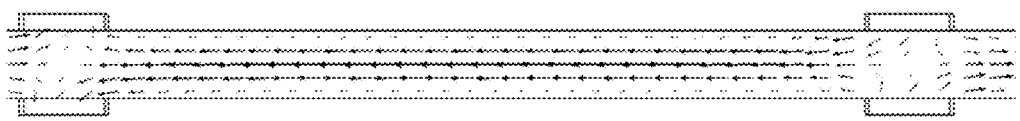
FIG. 3 is a schematic diagram showing a polarization electric field generated by a parasitic mode in an embodiment of the present disclosure.

As shown in FIG. 2, in the related art, an electric field is applied on one side of a piezoelectric base, which may be equivalent to the fact that a polarization direction is parallel to a surface of the piezoelectric base and perpendicular to a metal bus bar of an interdigital transducer. To a certain extent, the polarization electric field has a large component (z component) in a direction perpendicular to the surface of the base, especially in an area directly below the metal bus bar of the interdigital transducer, and the component of the polarization electric field will cause particles in the piezoelectric base to generate a displacement component along a thickness direction. The displacement component will generate an elastic wave meeting a resonance condition at a specific frequency, thereby generating a parasitic mode, and thus a parasitic clutter is generated at an admittance curve. In addition, due to the presence of the parasitic mode, it will cause energy loss of a main mode, thereby decreasing a Q factor value of the device in the main mode in a whole frequency band. In order to minimize the influence of the parasitic mode on the device, as shown in FIG. 3, there is another interdigital transducer provided at a corresponding position on the other side of the piezoelectric base, and the interdigital transducers on both sides of the piezoelectric base have the same polarity, such that the polarization electric fields along the thickness direction generated on the upper and lower surfaces of the piezoelectric base may be mutually counteracted, thereby reducing the displacement component along the thickness direction when the particle polarization occurs, reducing the parasitic clutter on the admittance curve, and improving the Q factor value of the device.

Figure 4:
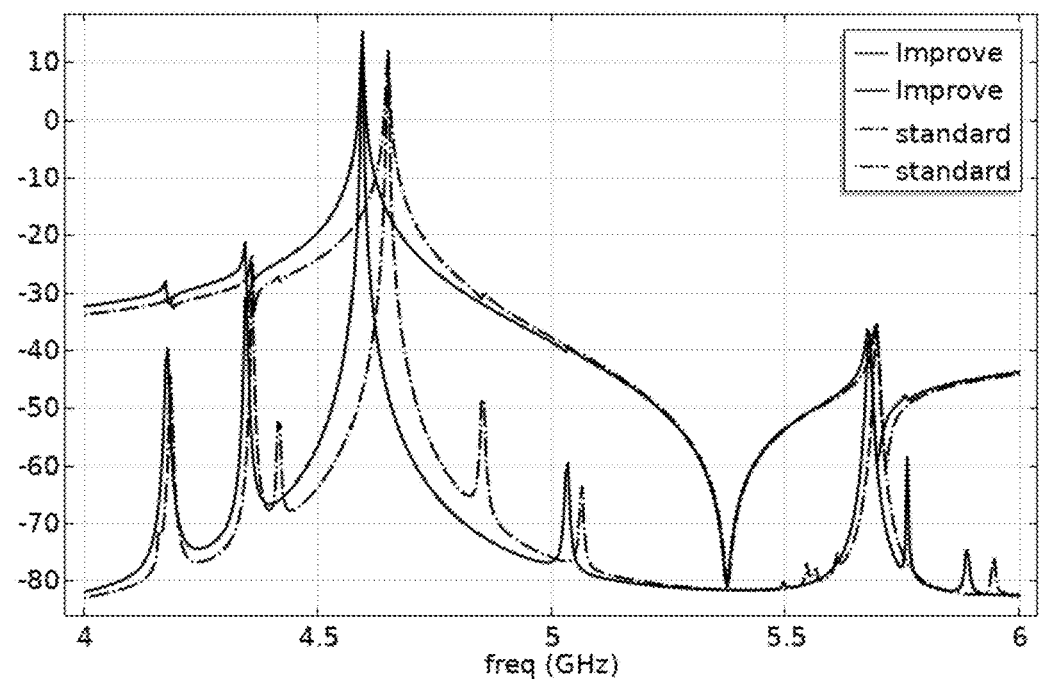
FIG. 4 is a graph showing admittance characteristic curves of a resonator in a related art and a laterally excited bulk wave resonator in an embodiment of the present disclosure.
Figure 5:
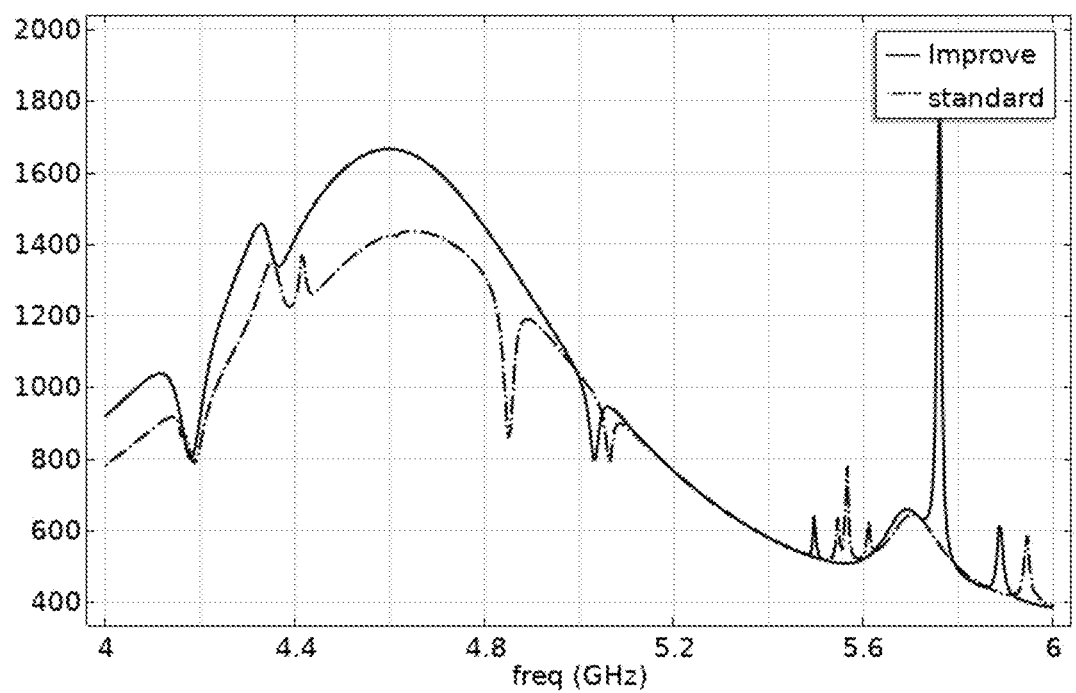
FIG. 5 is a graph showing of Q factor characteristic curves of a resonator in a related art and a laterally excited bulk wave resonator in an embodiment of the present disclosure.

The present disclosure is further explained by simulation results. According to the present disclosure, opposite metal electrodes are provided on both sides of the piezoelectric base. FIG. 4 is a graph showing admittance characteristic curves of a resonator in a related art and a laterally excited bulk wave resonator in an embodiment of the present disclosure. As shown in FIG. 4, the solid line represents the admittance characteristic curve of the laterally excited bulk wave resonator (XBAR) in an embodiment of the present disclosure, and the dotted line represents the admittance characteristic curve of a traditional XBAR in the related art. Compared with the traditional XBAR, the XBAR in an embodiment of the present disclosure has less clutter between a resonant frequency and an anti-resonant frequency, and a larger interval between the resonant frequency and the anti-resonant frequency. That is, the XBAR in an embodiment of the present disclosure has a higher electromechanical coupling coefficient. FIG. 5 is a graph showing of Q factor characteristic curves of a resonator in a related art and a laterally excited bulk wave resonator in an embodiment of the present disclosure. As shown in FIG. 5, compared with the traditional XBAR, the XBAR in an embodiment of the present disclosure has a higher Q factor value in a larger frequency band.

In some embodiments, a first bus bar of the lower interdigital transducer 4 is electrically connected with a second bus bar of the upper interdigital transducer 5 at a position corresponding to the first bus bar.

The electrical connection between the lower interdigital transducer 4 and the upper interdigital transducer 5 may make the first interdigital electrode of the lower interdigital transducer 4 have the same polarity as the second interdigital electrode of the upper interdigital transducer 5 at a position corresponding to the first interdigital electrode.

Figure 6:
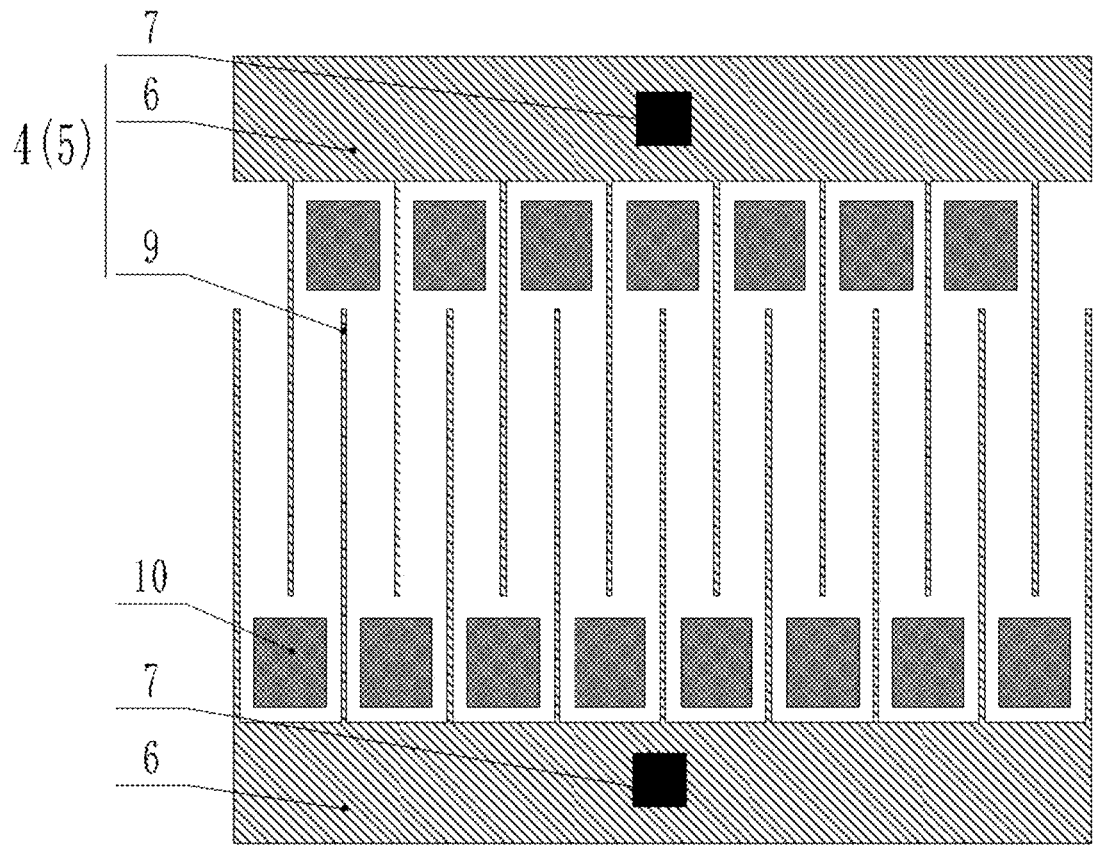
FIG. 6 is a schematic top view showing a laterally excited bulk wave resonator in an embodiment of the present disclosure.
Figure 7:
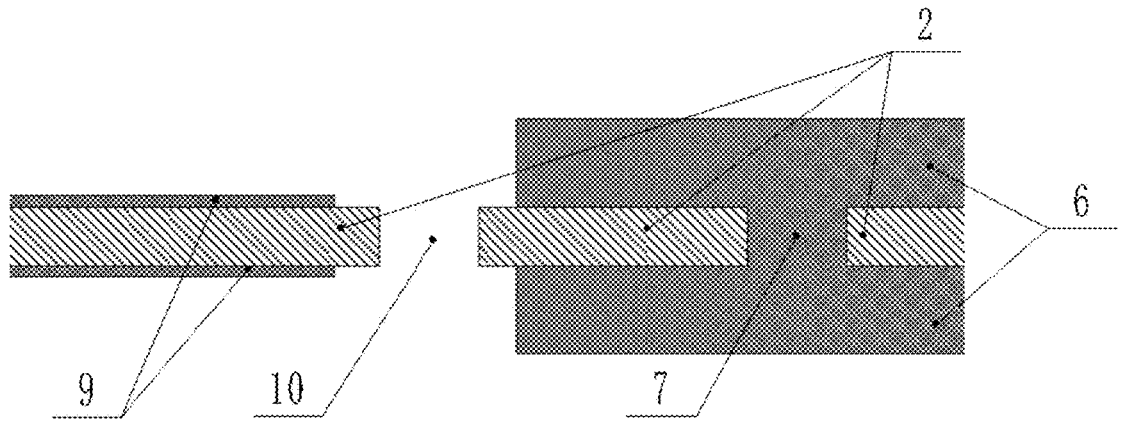
FIG. 7 is a schematic cross-sectional view showing a metallized through hole and a through hole of a laterally excited bulk wave resonator in an embodiment of the present disclosure.

In some embodiments, as shown in FIG. 6 and FIG. 7, a metallized through hole 7 is provided at a position of the piezoelectric base 2 corresponding to the bus bars 6, and configured to connect the first bus bar of the lower interdigital transducer 4 with the second bus bar of the upper interdigital transducer 5.

The metallized through hole 7 is provided in the piezoelectric base 2 to form the electrical connection between the lower interdigital transducer 4 and the upper interdigital transducer 5, which may make the first interdigital electrode of the lower interdigital transducer 4 have the same polarity as the second interdigital electrode of the upper interdigital transducer 5 at the position corresponding to the first interdigital electrode. In some embodiments, the metallized through hole may be made at the bus bar position, which may reduce process difficulty. The metallized through hole may be prepared according to conventional methods, and will not be described here. It could be understood that in addition to drilling at a position corresponding to the bus bar, the electrical connection between the lower interdigital transducer 4 and the upper interdigital transducer 5 may be formed in other ways, such as drilling at a position outside the bus bar or making the electrode bypass an edge of the piezoelectric base 2 to form a connection without drilling.

As shown in FIG. 1, the laterally excited bulk wave resonator further includes a first dielectric layer provided on the back side of the piezoelectric base 2, and configured to cover the lower interdigital transducer 4. Alternatively, the laterally excited bulk wave resonator further includes a second dielectric layer provided on the front side of the piezoelectric base 2, and configured to cover the upper interdigital transducer 5.

A dielectric layer 8 may be provided on at least one of the back side and the front side of the piezoelectric base 2. In some embodiments, a sum of a thickness of the dielectric layer 8 and a thickness of the piezoelectric base 2 is an integral multiple of a half-wavelength. The thickness of the dielectric layer 8 may be greater than, less than or equal to the thickness of the metal electrode, which may be selected by those skilled in the art as needed. By depositing the dielectric layer 8 on at least one of the back side and the front side of the piezoelectric base 2, the resonant frequency of the resonator may be conveniently adjusted. In this way, the resonator may have different frequencies by depositing the dielectric layers having different thicknesses.

In some embodiments, the sum of the thickness of the dielectric layer 8 and the thickness of the piezoelectric base 2 is an odd multiple of the half-wavelength.

Due to symmetry, if the sum of the thickness of the dielectric layer 8 and the thickness of the piezoelectric base 2 is an even multiple of the half-wavelength, it is possible to generate coherent cancellation of an even order harmonics wave. Therefore, the sum of the thickness of the dielectric layer 8 and the thickness of the piezoelectric base 2 is an odd multiple of the half-wavelength.

In some embodiments, the dielectric layer 8 may be formed of a material having a positive temperature coefficient. In some embodiments, the material of the dielectric layer 8 may be $SiO_2$.

The material having the positive temperature coefficient may have a temperature compensation effect on the XBAR device, which may reduce frequency offset caused by the temperature. $SiO_2$ is a positive temperature coefficient, which may be used in the resonator.

In some embodiments, as shown in FIG. 1, the upper interdigital transducer 5 and the lower interdigital transducer 4 are symmetrically arranged on the front side and the back side of the piezoelectric base 2, and the first dielectric layer and the second dielectric layer are symmetrically arranged on the back side and the front side of the piezoelectric base 2, which may significantly reduce the process difficulty.

In some embodiments, as shown in FIG. 6 and FIG. 7, a through hole 10 runs through the piezoelectric base 2, and is located in a first gap between a first interdigital electrode of the lower interdigital transducer 4 and the first bus bar of the lower interdigital transducer 4 and a second gap between a second interdigital electrode of the upper interdigital transducer 5 and the second bus bar of the upper interdigital transducer 5.

In an embodiment, the lower interdigital transducer 4 includes at least one pair of lower bus bars, e.g., a first lower bus bar and a second lower bus bar, as well as at least one pair of lower electrodes, e.g., a first lower electrode connected with the first lower bus bar and a second lower electrode connected with the second lower bus bar. The upper interdigital transducer 5 includes at least one pair of upper bus bars, e.g., a first upper bus bar corresponding to the first lower bus bar and a second upper bus bar corresponding to the second lower bus bar, as well as at least one pair of upper electrodes, e.g., a first upper electrode connected with the first upper bus bar and a second upper electrode connected with the second upper bus bar. A first through hole 10 is located in a first gap between the first lower electrode and the second lower bus bar of the lower interdigital transducer 4 and a second gap between the first upper electrode and the second upper bus bar of the upper interdigital transducer 5. Alternatively, a second through hole 10 is located in a third gap between the second lower electrode and the first lower bus bar of the lower interdigital transducer 4 and a fourth gap between the second upper electrode and the first upper bus bar of the upper interdigital transducer 5.

The through hole 10 is formed by a BPM punching machine in the gap between the interdigital electrode 9 and the bus bar 6, and the through hole 10 may excite a Piston mode, which may inhibit the transverse resonance and further reduce the parasitic mode.

Figure 8:
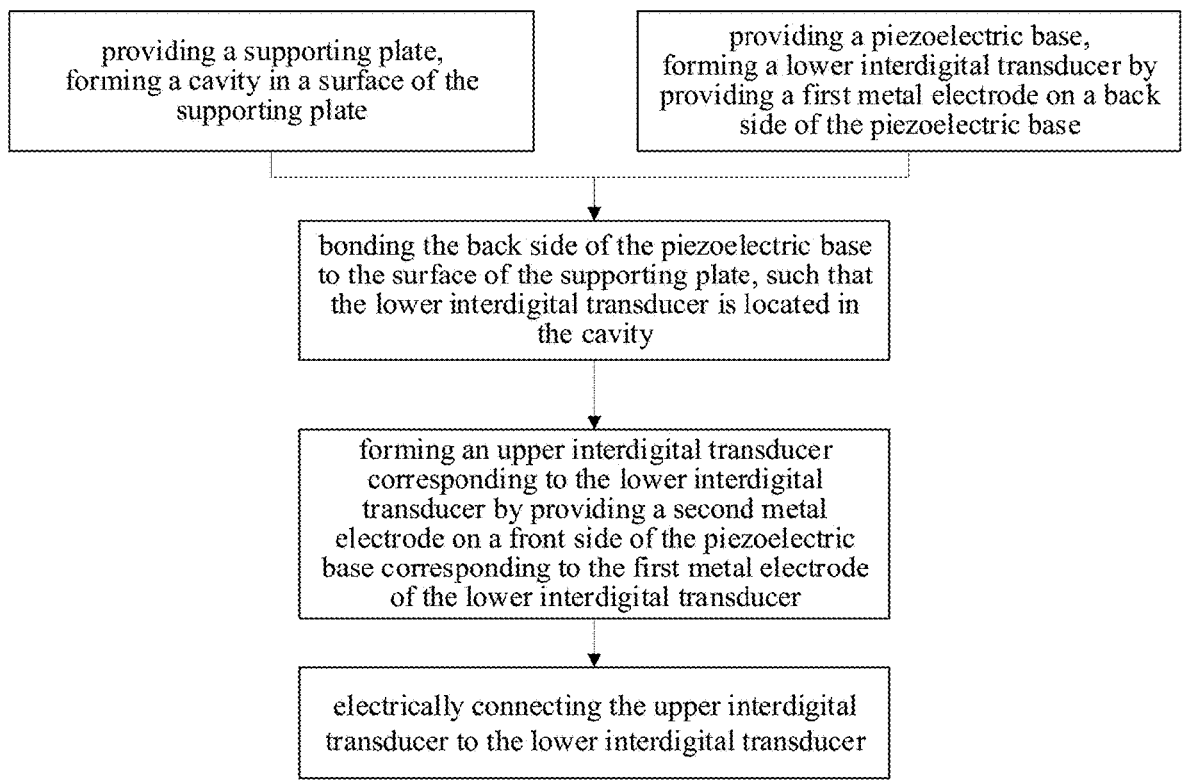
FIG. 8 is a flow chart of a method for fabricating a laterally excited bulk wave resonator in an embodiment of the present disclosure.

In a second aspect of some embodiments in the present disclosure, a method for fabricating a laterally excited bulk wave resonator is provided, and as shown in FIG. 8, the method includes the following steps.

A supporting plate 1 is provided, and a cavity 3 is formed in a surface of the supporting plate 1.

A piezoelectric base 2 is provided. A lower interdigital transducer 4 is formed by providing a first metal electrode on a back side of the piezoelectric base 2.

The back side of the piezoelectric base 2 is bonded to the surface of the supporting plate, such that the lower interdigital transducer 4 is located in the cavity 3.

An upper interdigital transducer 5 corresponding to the lower interdigital transducer 4 is formed by providing a second metal electrode on a front side of the piezoelectric base 2 corresponding to the first metal electrode of the lower interdigital transducer 4.

The upper interdigital transducer 5 is electrically connected with the lower interdigital transducer 4.

The cavity 3 may be formed by etching the supporting plate. When the piezoelectric base 2 is bonded to the supporting plate 1, the lower interdigital transducer 4 is placed in the cavity 3. The lower interdigital transducer 4 corresponds to the upper interdigital transducer 5, and is electrically connected with the upper interdigital transducer 5, such that the lower interdigital transducer 4 may have the same polarity as the upper interdigital transducer 5, and a polarization electric field along a thickness direction generated on the back side and the front side of the piezoelectric base 2 may be mutually cancelled out, thereby reducing displacement component along the thickness direction when particle polarization occurs, reducing a clutter on an admittance curve, and correspondingly increasing a Q factor value of a device.

In some embodiments, after forming the lower interdigital transducer 4, the method further includes providing a first dielectric layer on the back side of the piezoelectric base 2 to cover the lower interdigital transducer 4. In this way, the resonant frequency of the resonator may be adjusted by providing the second dielectric layer on the back side of the piezoelectric base 2.

In some embodiments, after forming the upper interdigital transducer 5, the method further includes providing a second dielectric layer on the front side of the piezoelectric base 2 to cover the upper interdigital transducer 5. In this way, the resonant frequency of the resonator may be adjusted by providing the first dielectric layer on the front side of the piezoelectric base 2.

In some embodiments, electrically connecting the upper interdigital transducer 5 to the lower interdigital transducer 4 includes forming a metallized through hole 7 connecting a first bus bar of the lower interdigital transducer 4 with a second bus bar of the upper interdigital transducer 5.

The metallized through hole 7 may be formed by the following steps. A via hole is punched at the first bus bar of the lower interdigital transducer 4 and the second bus bar of the upper interdigital transducer 5. An inner wall of the via hole is electroplated with a metal to form a connection between the upper interdigital transducer 5 and the lower interdigital transducer 4.

In some embodiments, after forming the upper interdigital transducer 5, the method further includes forming a through hole 10 running through the piezoelectric base 2, and located in a first gap between a first interdigital electrode of the lower interdigital transducer 4 and the first bus bar of the lower interdigital transducer 4 and a second gap between a second interdigital electrode of the upper interdigital transducer 5 and the second bus bar of the upper interdigital transducer 5.

According to the laterally excited bulk wave resonator in embodiments of the present disclosure, the lower interdigital transducer is provided at the back side of the piezoelectric base, and the upper interdigital transducer is provided at the front side of the piezoelectric base corresponding to the lower interdigital transducer, such that both sides of the piezoelectric base are provided with the interdigital transducers. The first interdigital electrode of the lower interdigital transducer has a same polarity as the second interdigital electrode of the upper interdigital transducer at a position corresponding to the first interdigital electrode, such that polarization electric fields along a thickness direction generated on the back side and the front side of the piezoelectric base may be mutually cancelled, which reduces a displacement component along the thickness direction when the particle is polarized, thereby reducing the clutter on the admittance curve, and improving the Q factor value of the device.

The first bus bar of the lower interdigital transducer is electrically connected with the second bus bar of the upper interdigital transducer at a position corresponding to the first bus bar, such that the first bus bar may have the same polarity as the second bus bar.

The dielectric layer is provided on at least one of the front side and the back side of the piezoelectric base, such that the resonant frequency of the resonator may be conveniently adjusted.

The through hole running through the piezoelectric base is located in the gap between the interdigital electrode and the bus bar, such that the transverse resonance may be suppressed, thereby further reducing the parasitic mode.

The technical features of the above-mentioned embodiments may be combined in any suitable manner. In order to make the description concise, all possible combinations of the technical features of the above-mentioned embodiments are not described. However, as long as there is no contradiction in the combination of these technical features, it should be considered within the scope of the present specification.

The above-mentioned embodiments only describe several implementations of the present disclosure specifically and in detail, but cannot be understood as a limitation on the scope of the present disclosure. It would be appreciated by those skilled in the art that certain modifications and improvements can be made in the embodiments without departing from the concept of the present disclosure, and these modifications and improvements belong to the protection scope of the present disclosure. Therefore, the protection scope of the present disclosure shall be defined in the appended claims.

What is claimed is:

1. A laterally excited bulk wave resonator, comprising:
   a supporting plate;
   a piezoelectric base having a back side attached to the supporting plate, wherein a cavity is defined on a side of the supporting plate facing toward the piezoelectric base;
   a lower interdigital transducer provided at the back side of the piezoelectric base and located in the cavity; and
   an upper interdigital transducer provided at a front side of the piezoelectric base corresponding to the lower interdigital transducer;
   wherein a first interdigital electrode of the lower interdigital transducer has a same polarity as a second interdigital electrode of the upper interdigital transducer at a position corresponding to the first interdigital electrode;
   wherein the laterally excited bulk wave resonator further comprises a through hole running through the piezoelectric base, and located in a first gap between the first interdigital electrode of the lower interdigital transducer and a first bus bar of the lower interdigital transducer and a second gap between the second interdigital electrode of the upper interdigital transducer and a second bus bar of the upper interdigital transducer.

2. The laterally excited bulk wave resonator according to claim 1, wherein the first bus bar of the lower interdigital transducer is electrically connected with the second bus bar of the upper interdigital transducer at a position corresponding to the first bus bar.

3. The laterally excited bulk wave resonator according to claim 2, further comprising:
   a metallized through hole provided at the position of the piezoelectric base corresponding to the first bus bar and the second bus bar, and configured to connect the first bus bar of the lower interdigital transducer with the second bus bar of the upper interdigital transducer.

4. The laterally excited bulk wave resonator according to claim 1, further comprising:
   a first dielectric layer provided on the back side of the piezoelectric base, and configured to cover the lower interdigital transducer.

5. The laterally excited bulk wave resonator according to claim 4, further comprising:
   a second dielectric layer provided on the front side of the piezoelectric base, and configured to cover the upper interdigital transducer.

6. The laterally excited bulk wave resonator according to claim 5, wherein a sum of a thickness of the first dielectric layer, a thickness of the second dielectric layer and a thickness of the piezoelectric base is an odd multiple of a half-wavelength.

7. The laterally excited bulk wave resonator according to claim 1, wherein the lower interdigital transducer comprises a first lower bus bar and a second lower bus bar, as well as a first lower electrode connected with the first lower bus bar and a second lower electrode connected with the second lower bus bar; and
   the upper interdigital transducer comprises a first upper bus bar corresponding to the first lower bus bar and a second upper bus bar corresponding to the second lower bus bar, as well as a first upper electrode connected with the first upper bus bar and a second upper electrode connected with the second upper bus bar.

8. The laterally excited bulk wave resonator according to claim 7, further comprising:
   a first through hole running through the piezoelectric base, and located in a first gap between the first lower electrode and the second lower bus bar of the lower interdigital transducer and a second gap between the first upper electrode and the second upper bus bar of the upper interdigital transducer.

9. The laterally excited bulk wave resonator according to claim 7, further comprising:
   a second through hole running through the piezoelectric base, and located in a third gap between the second lower electrode and the first lower bus bar of the lower interdigital transducer and a fourth gap between the second upper electrode and the first upper bus bar of the upper interdigital transducer.

10. A method for fabricating a laterally excited bulk wave resonator, comprising:
    providing a supporting plate;
    forming a cavity in a surface of the supporting plate;
    providing a piezoelectric base;
    forming a lower interdigital transducer by providing a first interdigital electrode on a back side of the piezoelectric base;
    bonding the back side of the piezoelectric base to the surface of the supporting plate, such that the lower interdigital transducer is located in the cavity;
    forming an upper interdigital transducer corresponding to the lower interdigital transducer by providing a second interdigital electrode on a front side of the piezoelectric base corresponding to the first interdigital electrode of the lower interdigital transducer;
    electrically connecting the upper interdigital transducer to the lower interdigital transducer; and
    forming a through hole running through the piezoelectric base, and located in a first gap between the first interdigital electrode of the lower interdigital transducer and a first bus bar of the lower interdigital transducer and a second gap between the second interdigital electrode of the upper interdigital transducer and a second bus bar of the upper interdigital transducer.

11. The method according to claim 10, further comprising:
    providing a first dielectric layer on the back side of the piezoelectric base to cover the lower interdigital transducer.

12. The method according to claim 10, further comprising:
    providing a second dielectric layer on the front side of the piezoelectric base to cover the upper interdigital transducer.

13. The method according to claim 10, wherein electrically connecting the upper interdigital transducer to the lower interdigital transducer comprises:
    forming a metallized through hole connecting the first bus bar of the lower interdigital transducer with the second bus bar of the upper interdigital transducer.

14. The method according to claim 10, wherein forming the lower interdigital transducer comprises forming a first lower bus bar and a second lower bus bar, as well as a first lower electrode connected with the first lower bus bar and a second lower electrode connected with the second lower bus bar; and
    forming the upper interdigital transducer comprises forming a first upper bus bar corresponding to the first lower bus bar and a second upper bus bar corresponding to the second lower bus bar, as well as a first upper electrode connected with the first upper bus bar and a second upper electrode connected with the second upper bus bar.

15. The method according to claim 14, further comprising:
    forming a first through hole running through the piezoelectric base, and located in a first gap between the first lower electrode and the second lower bus bar of the lower interdigital transducer and a second gap between the first upper electrode and the second upper bus bar of the upper interdigital transducer.

16. The method according to claim 14, further comprising:
    forming a second through hole running through the piezoelectric base, and located in a third gap between the second lower electrode and the first lower bus bar of the lower interdigital transducer and a fourth gap between the second upper electrode and the first upper bus bar of the upper interdigital transducer.

* * * * *